(12) United States Patent
Masuda

(10) Patent No.: US 11,936,305 B2
(45) Date of Patent: Mar. 19, 2024

(54) SEMICONDUCTOR DEVICE, SEMICONDUCTOR MODULE, AND POWER CONVERSION APPARATUS

(71) Applicant: Mitsubishi Electric Corporation, Tokyo (JP)

(72) Inventor: Koichi Masuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 47 days.

(21) Appl. No.: 17/653,684

(22) Filed: Mar. 7, 2022

(65) Prior Publication Data
US 2023/0006571 A1    Jan. 5, 2023

(30) Foreign Application Priority Data

Jul. 2, 2021   (JP) ................................ 2021-110640

(51) Int. Cl.
| | |
|---|---|
| *H02M 7/487* | (2007.01) |
| *H01L 25/07* | (2006.01) |
| *H01L 25/18* | (2023.01) |
| *H02M 7/00* | (2006.01) |
| *H02M 7/537* | (2006.01) |

(52) U.S. Cl.
CPC .......... *H02M 7/487* (2013.01); *H01L 25/072* (2013.01); *H01L 25/18* (2013.01); *H02M 7/003* (2013.01); *H02M 7/537* (2013.01)

(58) Field of Classification Search
CPC ...... H02M 7/487; H02M 7/003; H02M 7/537; H01L 25/072; H01L 25/18
See application file for complete search history.

(56) References Cited

U.S. PATENT DOCUMENTS

| | | | |
|---|---|---|---|
| 2014/0119088 A1* | 5/2014 | Chen ..................... | H02M 7/487 363/134 |
| 2016/0028224 A1 | 1/2016 | Yamada et al. | |
| 2018/0097453 A1* | 4/2018 | Xu ........................... | H02M 7/48 |
| 2019/0267912 A1* | 8/2019 | Ishino ..................... | H01L 24/42 |

FOREIGN PATENT DOCUMENTS

WO     2015/049743 A1    4/2015

* cited by examiner

*Primary Examiner* — Gary L Laxton
(74) *Attorney, Agent, or Firm* — Studebaker & Brackett PC

(57) ABSTRACT

An object is to provide a technique capable of improving the power efficiency of a semiconductor device. The semiconductor device includes first to sixth parallel connection bodies, each including a semiconductor switching element and a diode connected in antiparallel to the semiconductor switching element. At least one of the voltage drops of the second parallel connection body and the third parallel connection body is smaller than a voltage drop of at least one of the first parallel connection body, the fourth parallel connection body, the fifth parallel connection body, and the sixth parallel connection body.

12 Claims, 4 Drawing Sheets

SEMICONDUCTOR DEVICE, SEMICONDUCTOR MODULE, AND POWER CONVERSION APPARATUS

FIELD OF THE INVENTION

The present disclosure relates to a semiconductor device, a semiconductor module, and a power conversion apparatus.

DESCRIPTION OF THE BACKGROUND ART

In recent years, for example, the circuit in International Publication No. WO 2015/049743 and the Active Neutral-Point-Clamped (I-type ANPC) circuit have been proposed for improving the energy efficiency (power efficiency) of a three-level inverter.

SUMMARY

However, in a three-level inverter, power efficiency is required to be made higher in order to further reduction in energy loss.

The present disclosure has been made in view of the aforementioned issues, and it is an object of the present disclosure to provide a technique that ensures to make power efficiency higher.

According to the present disclosure, the semiconductor device includes a first parallel connection body, a second parallel connection body, a third parallel connection body, a fourth parallel connection body, a fifth parallel connection body, and sixth parallel connection body, each including a semiconductor switching element and a diode connected in antiparallel to the semiconductor switching element, in which the first parallel connection body, the second parallel connection body, the third parallel connection body, and the fourth parallel connection body are connected in series in this order from a first terminal having a first potential to a second terminal having a second potential which is lower than the first potential, a connection portion between the second parallel connection body and the third parallel connection body is connected to an AC terminal, the fifth parallel connection body and the sixth parallel connection body are connected in series in this order from a connection portion between the first parallel connection body and the second parallel connection body to a connection portion between the third parallel connection body and the fourth parallel connection body, the connection portion between the fifth parallel connection body and the sixth parallel connection body is connected to a third terminal having a third potential which is smaller than the first potential and is larger than the second potential, and at least one of voltage drops of the second parallel connection body and the third parallel connection body is smaller than a voltage drop of at least one of the first parallel connection body, the fourth parallel connection body, the fifth parallel connection body, and the sixth parallel connection body.

The power efficiency of the semiconductor device can be improved.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
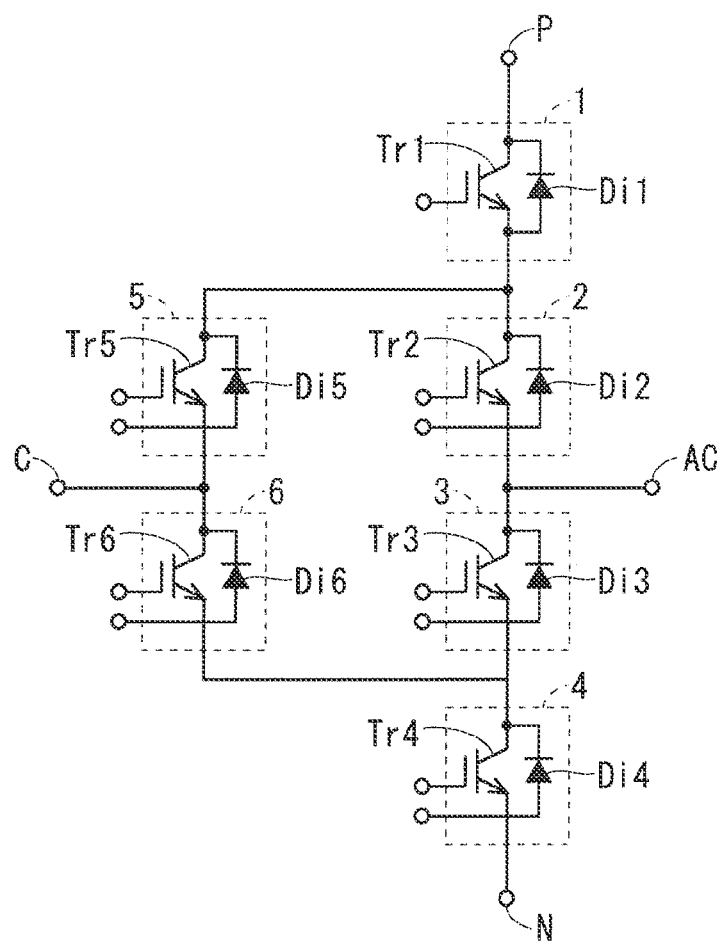
FIG. 1 is a circuit diagram illustrating a configuration of a semiconductor device according to the first embodiment.

Hereinafter, the embodiments will be described with reference to the attached drawings. The features described in each of the following embodiments are exemplary and not all features are required. Further, in the description to be made below, similar components are designated by the same or similar reference numerals in a plurality of embodiments, and different components will be mainly described.

First Embodiment

FIG. 1 is a circuit diagram illustrating a configuration of a semiconductor device according to the first embodiment. The semiconductor device in FIG. 1 is a three-level Active Neutral-Point-Clamped (ANPC) circuit, which includes a first parallel connection body 1, a second parallel connection body 2, a third parallel connection body 3, a fourth parallel connection body 4, and a fifth parallel connection body 5, and a sixth parallel connection body 6.

The first parallel connection body 1 includes a semiconductor switching element Tr1 and a diode Di1. Although the semiconductor switching element Tr1 in FIG. 1 is an Insulated Gate Bipolar Transistor (IGBT), it is not limited thereto, and another semiconductor switching element such as a MOSFET may be adopted. Although the diode Di1 in FIG. 1 is a PN junction diode, it is not limited thereto, and may be another diode such as a Zener diode or a Schottky barrier diode. In the first embodiment, the material of the semiconductor switching element Tr1 and the diode Di1 includes silicon (Si).

The diode Di1 is connected in antiparallel to the semiconductor switching element Tr1. That is, as illustrated in FIG. 1, when the semiconductor switching element Tr1 is a P-channel type semiconductor switching element, the cathode and anode of the diode Di1 are connected to the collector and the emitter of the semiconductor switching element Tr1, respectively.

The second parallel connection body 2 to the sixth parallel connection body 6 include the semiconductor switching elements Tr2 to Tr6 and the diodes Di2 to Di6, respectively, similarly to the first parallel connection body 1.

The first parallel connection body 1, the second parallel connection body 2, the third parallel connection body 3, and the fourth parallel connection body 4 are connected in series in this order from the high potential terminal P to the low potential terminal N. The high potential terminal P is a first terminal having a first potential, and the low potential terminal N is a second terminal having a second potential which is lower than the first potential. The connection portion between the second parallel connection body 2 and the third parallel connection body 3 is connected to an AC terminal AC.

The fifth parallel connection body 5 and the sixth parallel connection body 6 are connected in series in this order from the connection portion between the first parallel connection body 1 and the second parallel connection body 2, to the connection portion between the third parallel connection body 3 and the fourth parallel connection body 4. The connection portion between the fifth parallel connection body 5 and the sixth parallel connection body 6 is connected to an intermediate terminal C. The intermediate terminal C is a third terminal having a third potential that is smaller than the first potential of the high potential terminal P and larger than the second potential of the low potential terminal N.

Next, in the semiconductor device according to the first embodiment, the energization path of the first parallel connection body 1, the second parallel connection body 2, and the fifth parallel connection body 5 will be described.

When a current flows from the high potential terminal P to the AC terminal AC, the current flows through the semiconductor switching element Tr1 and the semiconductor switching element Tr2. When a current flows from the AC terminal AC to the high potential terminal P, the current flows through the diode Di2 and the diode Di1.

When a current flows from the intermediate terminal C to the AC terminal AC, the current flows through the diode Di5 and the semiconductor switching element Tr2. When a current flows from the AC terminal AC to the intermediate terminal C, the current flows through the diode Di2 and the semiconductor switching element Tr5.

As described above, the energization frequency of the second parallel connection body 2 connected to the AC terminal AC (corresponding to the energization ratio) is higher than that of both the first parallel connection body 1 and the fifth parallel connection body 5. In view of this, in the first embodiment, the voltage drop of the second parallel connection body 2 is configured to be smaller than any of the voltage drops of the first parallel connection body 1 and fifth parallel connection body 5.

Here, it is assumed that Vcesat is the on-voltage of the semiconductor switching element (collector-emitter saturation voltage) when a predetermined current flows, and VF is the on-voltage of the diode when the predetermined current flows (that is, forward voltage). The voltage drop of the semiconductor switching element corresponds to the Vcesat of the semiconductor switching element, and the voltage drop of the diode corresponds to the VF of the diode.

The establishment of the relationship that the voltage drop of the second parallel connection body 2 described above is smaller than the voltage drops of the first parallel connection body 1 and the fifth parallel connection body 5 indicates that in Vcesat and VF, the relationships of (1) and (2) as follows are established. (1) The Vcesat of the semiconductor switching element Tr2 is smaller than the Vcesat of the semiconductor switching element Tr1 and the VF of the diode Di5. (2) The VF of the diode Di2 is smaller than the VF of the diode Di1 and the Vcesat of the semiconductor switching element Tr5.

According to the semiconductor device of the first embodiment in which the voltage drop satisfies the above relationship, the conduction loss in the energization path of the first parallel connection body 1, the second parallel connection body 2, and the fifth parallel connection body 5 can be reduced; therefore, the power efficiency can be improved.

Similarly, the energization frequency of the third parallel connection body 3 connected to the AC terminal AC is higher than that of both the fourth parallel connection body 4 and the sixth parallel connection body 6. In view of this, in the first embodiment, the voltage drop of the third parallel connection body 3 is configured to be smaller than any of the voltage drops of the fourth parallel connection body 4 and the sixth parallel connection body 6. According to the semiconductor device of the first embodiment, the conduction loss in the energization path of the third parallel connection body 3, the fourth parallel connection body 4, and the sixth parallel connection body 6 can be reduced; therefore, the power efficiency can be improved.

The operation patterns of the first parallel connection body 1, the second parallel connection body 2, and the fifth parallel connection body 5 correspond to the operation patterns of the fourth parallel connection body 4, the third parallel connection body 3, and the sixth parallel connection body, respectively. Therefore, for example, the energization frequency of the second parallel connection body 2 being higher than the energization frequency of the first parallel connection body 1 and the fifth parallel connection body 5 corresponds to the energization frequency of the second parallel connection body 2 being higher than the energization frequency of the fourth parallel connection body 4 and the sixth parallel connection body 6. Therefore, the voltage drop of the second parallel connection body 2 is configured to be smaller than any of the voltage drops of the fourth parallel connection body 4 and the sixth parallel connection body 6.

Summarizing the above, in the first embodiment, both of the voltage drops of the second parallel connection body 2 and the third parallel connection body 3 are smaller than the voltage drop of every one of the first parallel connection body 1, the fourth parallel connection body 4, the fifth parallel connection body 5, and the sixth parallel connection body 6. According to such a configuration, the conduction loss can be reduced and the power efficiency of the semiconductor device can be improved.

Expanding the above, the configuration may be adopted in which, at least one of the voltage drops of the second parallel connection body 2 and the third parallel connection body 3 becomes smaller than the voltage drop of at least one of the first parallel connection body 1, the fourth parallel connection body 4, the fifth parallel connection body 5, and the sixth parallel connection body 6. Even with such a configuration, the same effect as the above configuration can be obtained to some extent.

Second Embodiment

Figure 2:
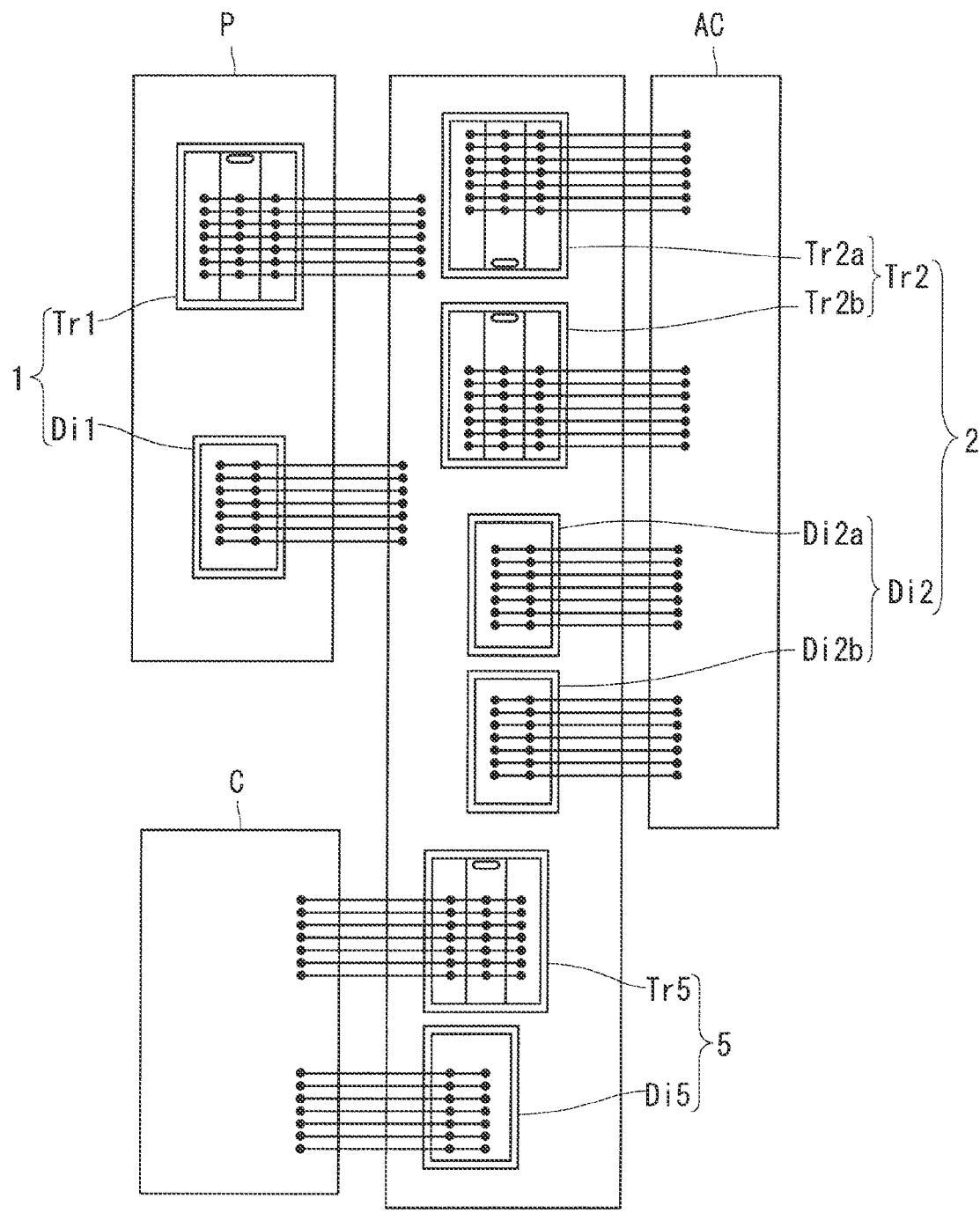
FIG. 2 is a plan view illustrating a configuration of a semiconductor device according to the second embodiment.

FIG. 2 is a plan view illustrating a configuration of a semiconductor device according to the second embodiment. Note that, in FIG. 2, the illustration of the gate wiring and the like is omitted so as not to complicate the drawing. Hereinafter, the parts of the second embodiment that are different from the first embodiment will be mainly described.

In FIG. 2, the semiconductor switching element Tr and the semiconductor switching element Tr5 are substantially the same as each other, and the semiconductor switching element Tr2 includes two semiconductor switching elements Tr2a and Tr2b (corresponding to two semiconductor switching elements Tr1) connected in parallel. Similarly, the diode Di1 and the diode Di5 are substantially the same as each other, and the diode Di2 includes two diodes Di2a, Di2b (corresponding to two diodes Di1) connected in parallel.

That is, in FIG. 2, the chip area of the second parallel connection body 2 is approximately twice the chip area of the first parallel connection body 1 and the fifth parallel connection body 5, and is larger than any of the chip areas of the first parallel connection body 1 and the fifth parallel connection body 5. According to such a configuration, the configuration described in the first embodiment, that is, a configuration in which the voltage drop of the second parallel connection body 2 is made smaller than the voltage drop of the first parallel connection body 1 and the fifth parallel connection body 5 is implemented. Further, by making the chip area of the second parallel connection body 2 relatively large, the heat dissipation area of the second parallel connection body 2 can be increased. Further, by making the chip areas of the first parallel connection body 1 and the fifth parallel connection body 5 relatively small, the size of the entire semiconductor device is suppressed from becoming large.

In addition, at least one of the chip areas of the second parallel connection body 2 and the third parallel connection body 3 may be larger than the chip area of at least one of the first parallel connection body 1, the fourth parallel connection body 4, the fifth parallel connection body 5, and the sixth parallel connection body 6. Even with such a configuration, the same effect as the above configuration can be obtained to some extent. For example, the configuration in which, at least one of the voltage drops of the second parallel connection body 2 and the third parallel connection body 3 becomes smaller than the voltage drop of at least one of the first parallel connection body 1, the fourth parallel connection body 4, the fifth parallel connection body 5, and the sixth parallel connection body 6 is implemented.

It should be noted that the voltage drop of the first parallel connection body 1 to the sixth parallel connection body 6 may be configured to satisfy the above relationship not based on the areas of the first parallel connection body 1 to the sixth parallel connection body 6 but on the impurity concentration of the first parallel connection body 1 to the sixth parallel connection body.

Third Embodiment

Hereinafter, the parts of the third embodiment that are different from the first and second embodiments will be mainly described. In the third embodiment, the voltage drops of each of the semiconductor switching elements Tr2 and Tr3 and the diodes Di2 and Di3 of each of the second parallel connection body 2 and the third parallel connection body 3 are 1.8 V or less.

Here, when the switching frequency of the second parallel connection body 2 and the third parallel connection body 3 is a low frequency such as 60 Hz, the ratio of the conduction loss to the switching loss becomes dominant. Whereas, according to the configuration of the third embodiment, the element having a relatively low voltage drop is used, the reduction in the conduction loss can be expected.

Fourth Embodiment

Figure 3:
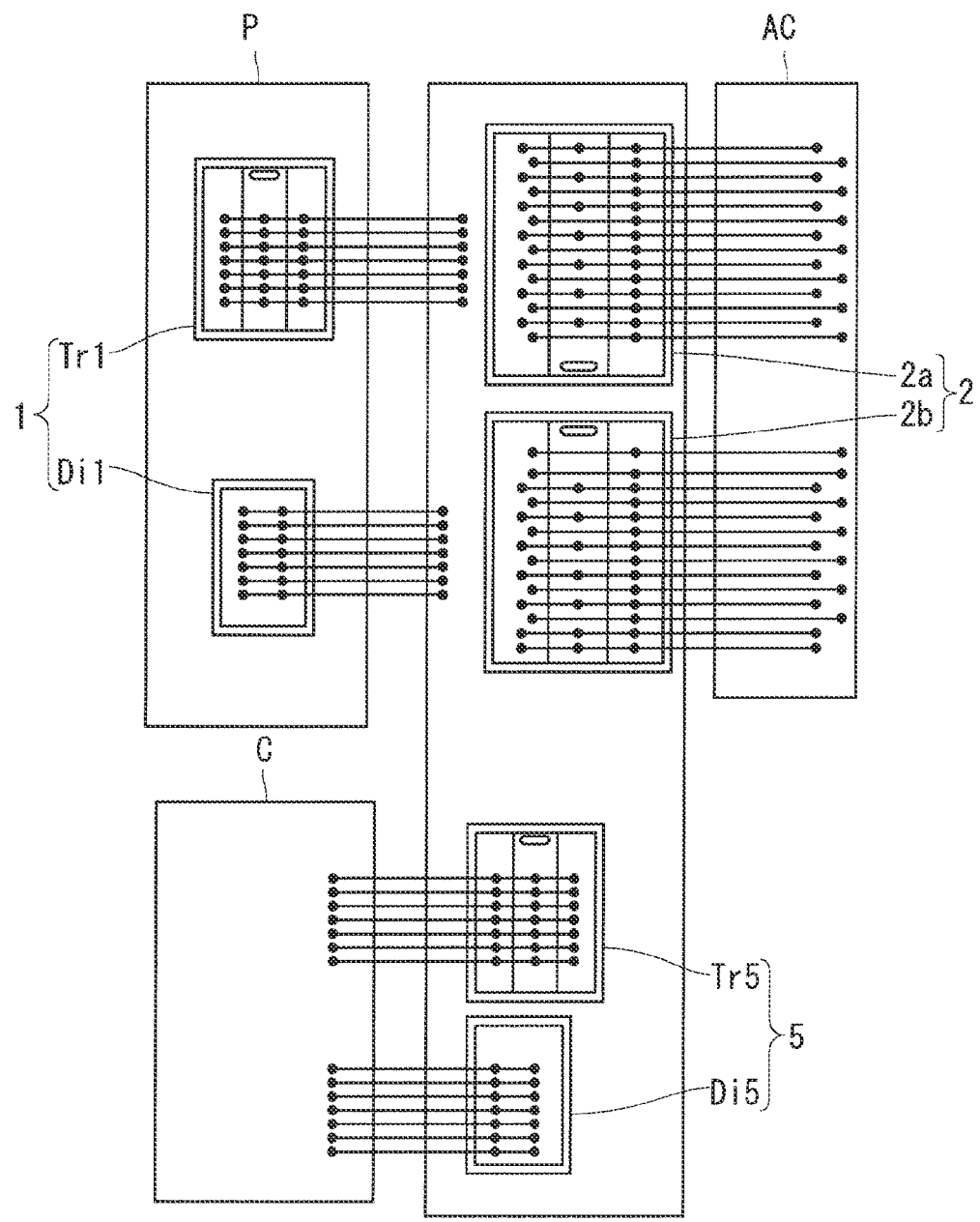
FIG. 3 is a plan view illustrating a configuration of a semiconductor device according to the fourth embodiment.
Figure 4:
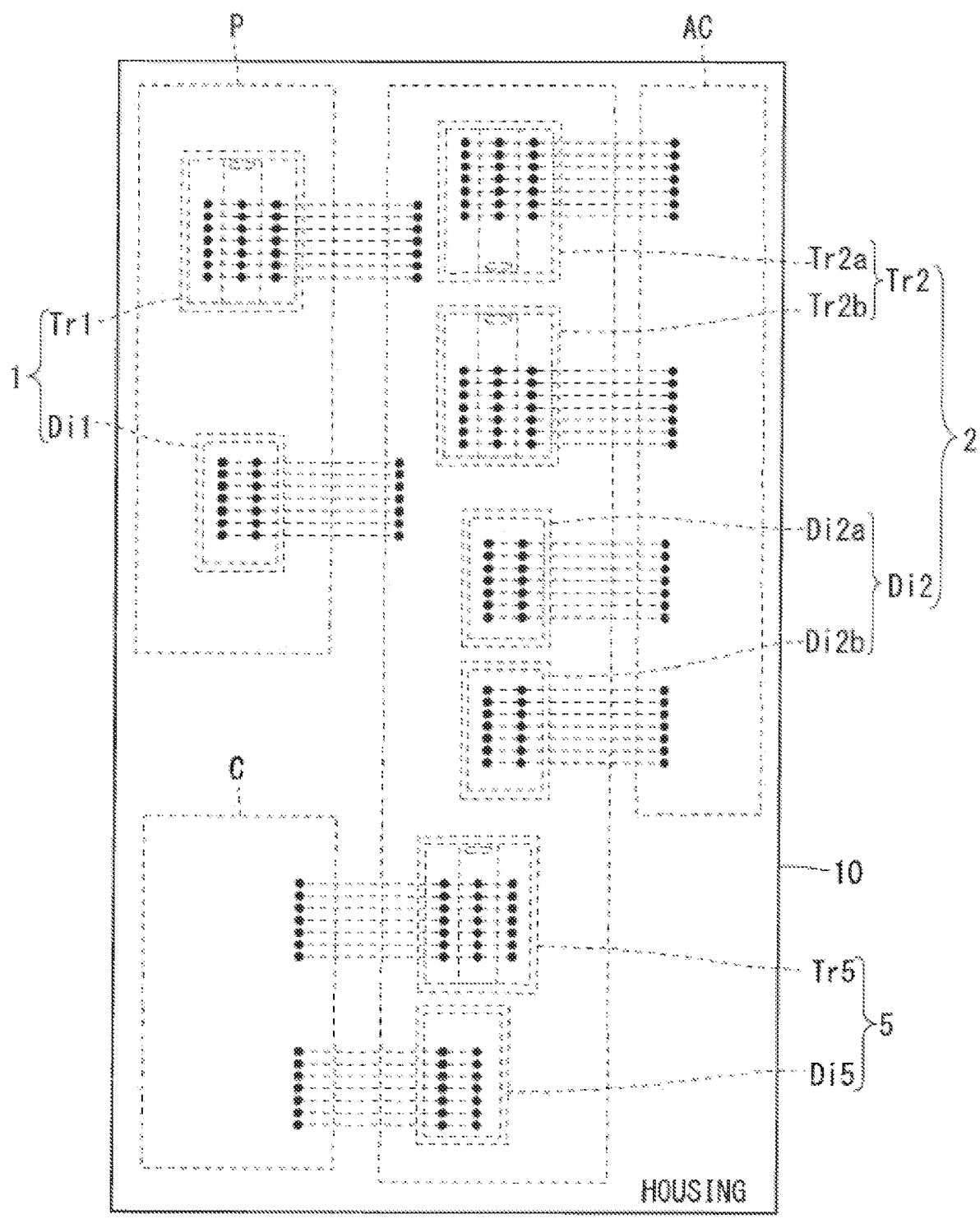
FIG. 4 is a plan view illustrating a configuration of a semiconductor device according to the seventh embodiment.

FIG. 3 is a plan view illustrating a configuration of a semiconductor device according to the fourth embodiment. Hereinafter, the parts of the fourth embodiment that are different from the second embodiment will be mainly described.

In FIG. 3, the second parallel connection body 2 includes the Reverse Conducting IGBTs (RC-IGBT) 2a and 2b of FIG. 3 as the semiconductor switching element Tr2 and the diode Di2. The RC-IGBT 2a corresponds to the semiconductor switching element Tr2a and the diode Di2a of FIG. 2, and the RC-IGBT 2b corresponds to the semiconductor switching element Tr2b and the diode Di2b of FIG. 2.

According to such a configuration, by applying the RC-IGBT to the second parallel connection body 2 which is the output stage of the three-level ANPC circuit having a relatively large number of elements, enhancement of the area efficiency of the semiconductor device, such as reduction in chip numbers and scaling down of the circuit pattern is ensured. In addition, wiring (for example, aluminum wire) connecting the second parallel connection body 2 and the circuit pattern of the AC terminal AC can be integrated. In addition, by using the RC-IGBTs 2a and 2b that enable bidirectional energization of the wiring, the temperature fluctuation of the wiring can be reduced; therefore, the extension of power cycle longevity can be expected.

Further extending the above, at least one of the second parallel connection body 2 and the third parallel connection body 3 may include an RC-IGBT as a semiconductor switching element and a diode. Even with such a configuration, the same effect as the above configuration can be obtained to some extent.

Fifth Embodiment

Hereinafter, the parts of the fifth embodiment that are different from the first to fourth embodiments will be mainly described. In the fifth embodiment, a material of at least one of the semiconductor switching element and the diode of at least one of the first parallel connection body 1, the fourth parallel connection body 4, the fifth parallel connection body 5, and the sixth parallel connection body 6 includes a wide bandgap semiconductor. The wide bandgap semiconductor include, for example, silicon carbide (SiC), gallium nitride (GaN), diamond and the like.

As described above, according to the fifth embodiment using the wide bandgap semiconductor, the reduction in the loss such as the switching loss is ensured.

Sixth Embodiment

Hereinafter, the parts of the sixth embodiment that are different from the first to fifth embodiments will be mainly described. In the sixth embodiment, regarding the diode and the semiconductor switching element included in at least one of the second parallel connection body 2 and the third parallel connection body 3, the on-voltage when a predetermined current of the diode flows is smaller than the on-voltage when the predetermined current of the semiconductor switching element flows. That is, regarding the diode and the semiconductor switching element included in at least one of the second parallel connection body 2 and the third parallel connection body 3, the VF corresponding to the forward voltage drop of the diode is smaller than the Vcesat of the semiconductor switching element to which the diode is connected. In order to make the VF of the diode smaller than the Vcesat of the semiconductor switching element, for example, the effective area of the diode is made larger than the effective area of the semiconductor switching element.

According to the sixth embodiment as described above, the VF of the diode is smaller than the Vcesat of the semiconductor switching element; therefore, the power efficiency on the operation in which the diode characteristic is dominant such as the regenerative operation is improved.

Seventh Embodiment

Hereinafter, the parts of the seventh embodiment that are different from the first to sixth embodiments will be mainly described. The semiconductor module according to the seventh embodiment includes the semiconductor device according to the first to sixth embodiments and one housing 10. One housing 10 is, for example, a resin package, and covers a set of the first parallel connection body 1, the second parallel connection body 2, and the fifth parallel connection body 5, or a set of the third parallel connection body 3, the fourth parallel connection body 4, and the sixth parallel connection body 6.

According to the seventh embodiment as described above, the resistance and the inductance of the package can be suppressed by covering the current path where the current and the time change (dI/dt) of the current occur in the circuit with one housing 10.

Noted that, the semiconductor module may include a first housing 10 covering the set of the first parallel connection body 1, the second parallel connection body 2, and the fifth parallel connection body 5, and a second housing 10 covering the set of the third parallel connection body 3, the fourth parallel connection body 4, and the sixth parallel connection body 6. Further, in the configuration in which RC-IGBT is used for at least one of the second parallel connection body 2 and the third parallel connection body 3 as in the fourth embodiment, the area efficiency is enhanced as described above; therefore, covering with one housing 10 is facilitated.

Eighth Embodiment

Hereinafter, the parts of the eighth embodiment that are different from the first to seventh embodiments will be mainly described. The power conversion apparatus according to the eighth embodiment is, for example, an inverter and a converter, and includes the semiconductor devices according to the first to seventh embodiments. According to such a configuration, a power conversion apparatus having improved power efficiency is implemented.

The embodiments and the modifications can be combined, and the embodiments and the modifications can be appropriately modified or omitted.

While the disclosure has been shown and described in detail, the foregoing description is in all aspects illustrative and not restrictive. It is therefore understood that numerous modifications and variations can be devised without departing from the scope of the disclosure.

What is claimed is:

1. A semiconductor device comprising
a first parallel connection body including a first semiconductor switching element and a first diode, the first diode connected in antiparallel to the first semiconductor switching element;
a second parallel connection body including a second semiconductor switching element and a second diode, the second diode connected in antiparallel to the second semiconductor switching element;
a third parallel connection body including a third semiconductor switching element and a third diode, the third diode connected in antiparallel to the third semiconductor switching element;
a fourth parallel connection body including a fourth semiconductor switching element and a fourth diode, the fourth diode connected in antiparallel to the fourth semiconductor switching element;
a fifth parallel connection body including a fifth semiconductor switching element and a fifth diode, the fifth diode connected in antiparallel to the fifth semiconductor switching element; and
a sixth parallel connection body including a sixth semiconductor switching element and a sixth diode, the sixth diode connected in antiparallel to the sixth semiconductor switching element, wherein
the first parallel connection body, the second parallel connection body, the third parallel connection body, and the fourth parallel connection body are connected in series, in order from the first parallel connection body to the second parallel connection body to the third parallel connection body to the fourth parallel connection body, from a first terminal having a first potential to a second terminal having a second potential which is lower than the first potential,
a connection portion between the second parallel connection body and the third parallel connection body is connected to an AC terminal,
the fifth parallel connection body and the sixth parallel connection body are connected in series, in order from the fifth parallel connection body to the sixth parallel connection body, from a first connection portion between the first parallel connection body and the second parallel connection body to a second connection portion between the third parallel connection body and the fourth parallel connection body,
a third connection portion between the fifth parallel connection body and the sixth parallel connection body is connected to a third terminal having a third potential which is smaller than the first potential and is larger than the second potential, and
at least one of a second voltage drop of the second parallel connection body and a third voltage drop of the third parallel connection body is smaller than at least one of a fifth voltage drop of the fifth parallel connection body and a sixth voltage drop of the sixth parallel connection body.

2. The semiconductor device according to claim 1, wherein
at least one of chip areas of the second parallel connection body and the third parallel connection body is larger than a chip area of at least one of the first parallel connection body, the fourth parallel connection body, the fifth parallel connection body, and the sixth parallel connection body.

3. The semiconductor device according to claim 1, wherein
voltage drops of each of the second semiconductor switching element, the second diode, the third semiconductor switching element, and the third diode are 1.8 V or less.

4. The semiconductor device according to claim 1, wherein
the second semiconductor switching element and the second diode; or the third semiconductor switching element and the third diode; or all of the second semiconductor switching element, the second diode, the third semiconductor switching element, and the third diode are an RC-IGBT.

5. The semiconductor device according to claim 1, wherein
a material of at least one of the first semiconductor switching element the first diode, the fourth semiconductor switching element, the fourth diode, the fifth semiconductor switching element, the fifth diode, the sixth semiconductor switching element, and the sixth diode includes a wide bandgap semiconductor.

6. The semiconductor device according to claim 1, wherein
a first on-voltage when a first predetermined current of the second diode flows is smaller than a second on-voltage when a second predetermined current of the second semiconductor switching element flows, or
a third on-voltage when a third predetermined current of the third diode flows is smaller than a fourth on-voltage when a fourth predetermined current of the third semiconductor switching element flows, or the first on-voltage when the first predetermined current of the second diode flows is smaller than the second on-voltage when the second predetermined current of the second semiconductor switching element flows, and the third on-voltage when the third predetermined current of the third diode flows is smaller than the fourth on-voltage when the fourth predetermined current of the third semiconductor switching element flows.

7. A semiconductor module comprising:
the semiconductor device according to claim 1; and
one housing covering a set of the first parallel connection body, the second parallel connection body, and the fifth parallel connection body, or a set of the third parallel connection body, the fourth parallel connection body, and the sixth parallel connection body.

8. A power conversion apparatus comprising
the semiconductor device according to claim 1.

9. The semiconductor device according to claim 1, wherein
at least one of the second voltage drop and the third voltage drop is smaller than each of the fifth voltage drop and the sixth voltage drop.

10. The semiconductor device according to claim 1, wherein
each of the second voltage drop and the third voltage drop is smaller than each of: the fifth voltage drop, the sixth voltage drop, a first voltage drop of the first parallel connection body, and a fourth voltage drop of the fourth parallel connection body.

11. A semiconductor device comprising
a first parallel connection body including a first semiconductor switching element and a first diode, the first diode connected in antiparallel to the first semiconductor switching element;
a second parallel connection body including a second semiconductor switching element and a second diode, the second diode connected in antiparallel to the second semiconductor switching element;
a third parallel connection body including a third semiconductor switching element and a third diode, the third diode connected in antiparallel to the third semiconductor switching element;
a fourth parallel connection body including a fourth semiconductor switching element and a fourth diode, the fourth diode connected in antiparallel to the fourth semiconductor switching element;
a fifth parallel connection body including a fifth semiconductor switching element and a fifth diode, the fifth diode connected in antiparallel to the fifth semiconductor switching element; and
a sixth parallel connection body including a sixth semiconductor switching element and a sixth diode, the sixth diode connected in antiparallel to the sixth semiconductor switching element, wherein
the first parallel connection body, the second parallel connection body, the third parallel connection body, and the fourth parallel connection body are connected in series, in order from the first parallel connection body to the second parallel connection body to the third parallel connection body to the fourth parallel connection body, from a first terminal having a first potential to a second terminal having a second potential which is lower than the first potential, a connection portion between the second parallel connection body and the third parallel connection body is connected to an AC terminal,
the fifth parallel connection body and the sixth parallel connection body are connected in series, in order from the fifth parallel connection body to the sixth parallel connection body, from a first connection portion between the first parallel connection body and the second parallel connection body to a second connection portion between the third parallel connection body and the fourth parallel connection body,
a third connection portion between the fifth parallel connection body and the sixth parallel connection body is connected to a third terminal having a third potential which is smaller than the first potential and is larger than the second potential,
at least one of a second voltage drop of the second parallel connection body and a third voltage drop of the third parallel connection body is smaller than at least one of a first voltage drop of the first parallel connection body, a fourth voltage drop of the fourth parallel connection body, a fifth voltage drop of the fifth parallel connection body, and a sixth voltage drop of the sixth parallel connection body, and
voltage drops of each of the second semiconductor switching element, the second diode, the third semiconductor switching element, and the third diode are 1.8 V or less.

12. A semiconductor device comprising:
a first parallel connection body including a first semiconductor switching element and a first diode, the first diode connected in antiparallel to the first semiconductor switching element;
a second parallel connection body including a second semiconductor switching element and a second diode, the second diode connected in antiparallel to the second semiconductor switching element;
a third parallel connection body including a third semiconductor switching element and a third diode, the third diode connected in antiparallel to the third semiconductor switching element;
a fourth parallel connection body including a fourth semiconductor switching element and a fourth diode, the fourth diode connected in antiparallel to the fourth semiconductor switching element;
a fifth parallel connection body including a fifth semiconductor switching element and a fifth diode, the fifth diode connected in antiparallel to the fifth semiconductor switching element; and
a sixth parallel connection body including a sixth semiconductor switching element and a sixth diode, the sixth diode connected in antiparallel to the sixth semiconductor switching element, wherein
the first parallel connection body, the second parallel connection body, the third parallel connection body, and the fourth parallel connection body are connected in series, in order from the first parallel connection body to the second parallel connection body to the third parallel connection body to the fourth parallel connection body, from a first terminal having a first potential to a second terminal having a second potential which is lower than the first potential,
a connection portion between the second parallel connection body and the third parallel connection body is connected to an AC terminal,
the fifth parallel connection body and the sixth parallel connection body are connected in series, in order from the fifth parallel connection body to the sixth parallel connection body, from a first connection portion between the first parallel connection body and the second parallel connection body to a second connection portion between the third parallel connection body and the fourth parallel connection body, a third connection portion between the fifth parallel connection body and the sixth parallel connection body is connected to a third terminal having a third potential which is smaller than the first potential and is larger than the second potential, at least one of a second voltage drop of the second parallel connection body and a third voltage drop of the third parallel connection body is smaller than at least one of a first voltage drop of the first parallel connection body, a fourth voltage drop of the fourth parallel connection body, a fifth voltage drop of the fifth parallel connection body, and a sixth voltage drop of the sixth parallel connection body, and a first on-voltage when a first predetermined current of the second diode flows is smaller than a second on-voltage when a second predetermined current of the second semiconductor switching element flows, or a third on-voltage when a third predetermined current of the third diode flows is smaller than a fourth on-voltage when a fourth predetermined current of the third semiconductor switching element flows, or the first on-voltage when the first predetermined current of the second diode flows is smaller than the second on-voltage when the second predetermined current of the second semiconductor switching element flows and the third on-voltage when the third predetermined current of the third diode flows is smaller than the fourth on-voltage when the fourth predetermined current of the third semiconductor switching element flows.

\* \* \* \* \*